United States Patent [19]

Ellis et al.

[11] Patent Number: 4,484,381
[45] Date of Patent: Nov. 27, 1984

[54] CLAMP ARRANGEMENTS

[75] Inventors: Stafford M. Ellis, West Sussex; James P. M. Keay, Kent, both of England

[73] Assignee: Marconi Avionics Limited, England

[21] Appl. No.: 399,960

[22] Filed: Jul. 19, 1982

[30] Foreign Application Priority Data

Jul. 24, 1981 [GB] United Kingdom ............ 8122993

[51] Int. Cl.³ .................................. A44B 21/00
[52] U.S. Cl. .............................. 24/523; 24/498; 24/524; 211/41; 269/235; 269/236; 269/275; 339/75 MP; 361/386; 361/415
[58] Field of Search ............ 24/248 E, 263 B, 498, 24/523, 524; 269/231, 235, 236, 257, 275, 903; 211/41, 45; 248/316 E, 441 R; 312/185, 257 A; 361/386, 415; 339/75 M, 75 MP, 75 R

[56] References Cited

U.S. PATENT DOCUMENTS

| | | | |
|---|---|---|---|
| 3,114,587 | 12/1963 | Herrmann | 339/75 MP |
| 3,568,134 | 3/1971 | Anhalt et al. | 339/75 MP |
| 3,665,370 | 5/1972 | Hartmann | 339/75 MP |
| 3,845,359 | 10/1974 | Fedele | 361/415 X |
| 3,975,805 | 8/1976 | Spurling et al. | |
| 4,176,900 | 12/1979 | Hines et al. | 339/75 MP |
| 4,252,390 | 2/1981 | Bowling | 339/75 R X |

Primary Examiner—William E. Lyddane
Assistant Examiner—James R. Brittain
Attorney, Agent, or Firm—Kirschstein, Kirschstein, Ottinger & Israel

[57] ABSTRACT

An assembly comprising a board 1 and a mechanism 17 for clamping a marginal portion of the board adjacent an edge between two opposed substantially flat parallel walls 7a. The mechanism 17 is mounted on a major surface 19 of the board 1 and includes a spring strip 21 extending longitudinally along the mechanism, and having corrugations transverse to its length. An elongate cam 27 extends along the length of the strip 21, overlying the strip, and being supported for rotation about its longitudinal axis. Rotation of the cam 27 causes expansion of the mechanism 17 in a direction normal to the surface 19, limitation of the expansion by the walls 7a leading to compression of the corrugations in the strip 21.

19 Claims, 18 Drawing Figures

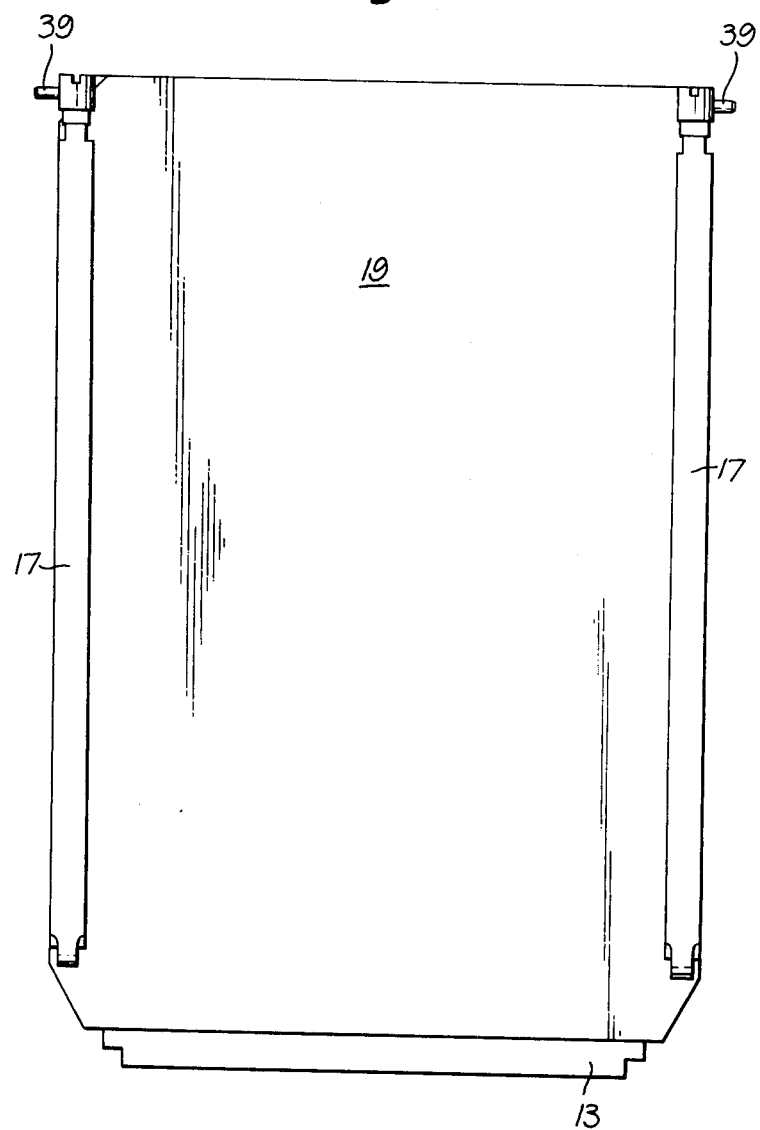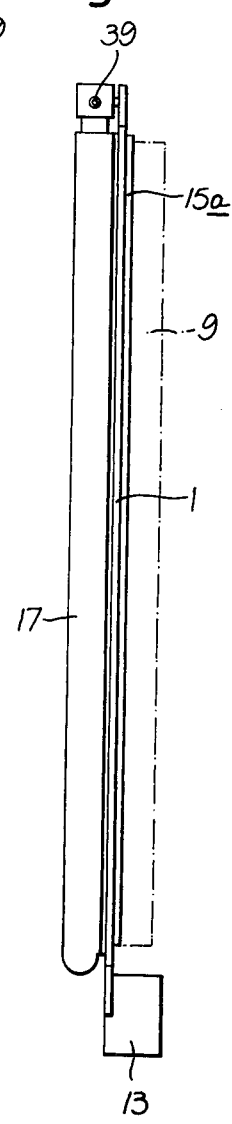

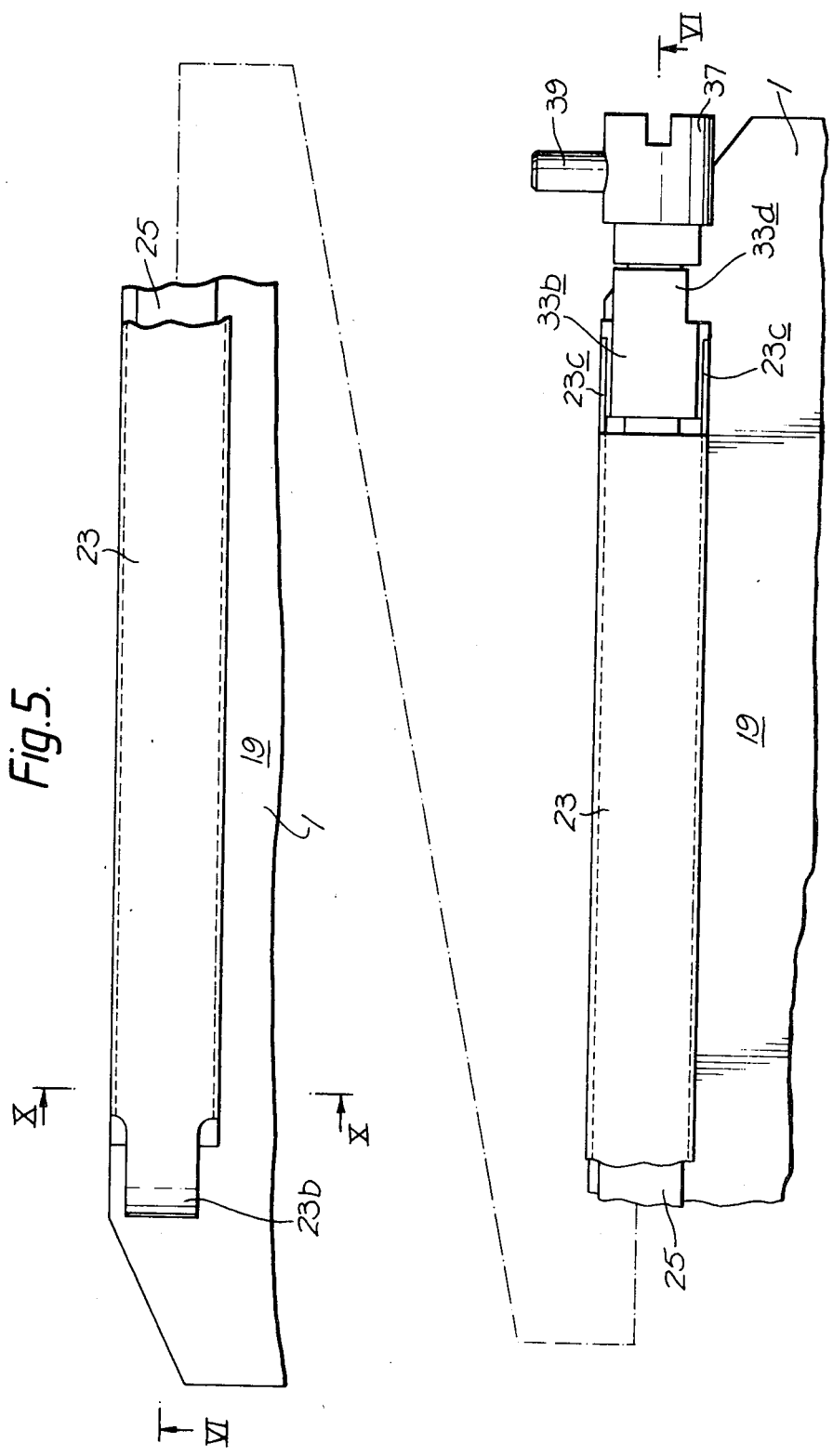

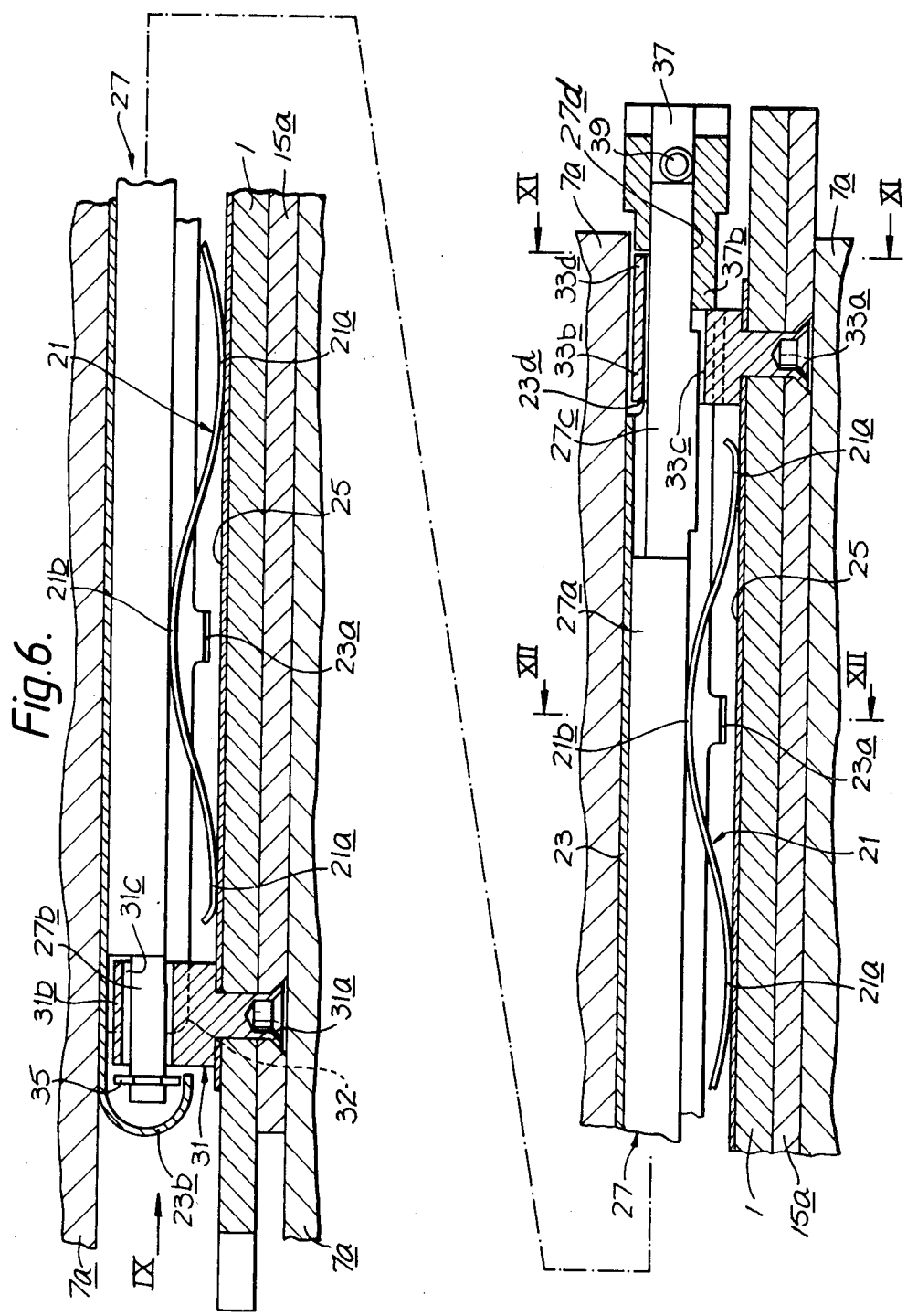

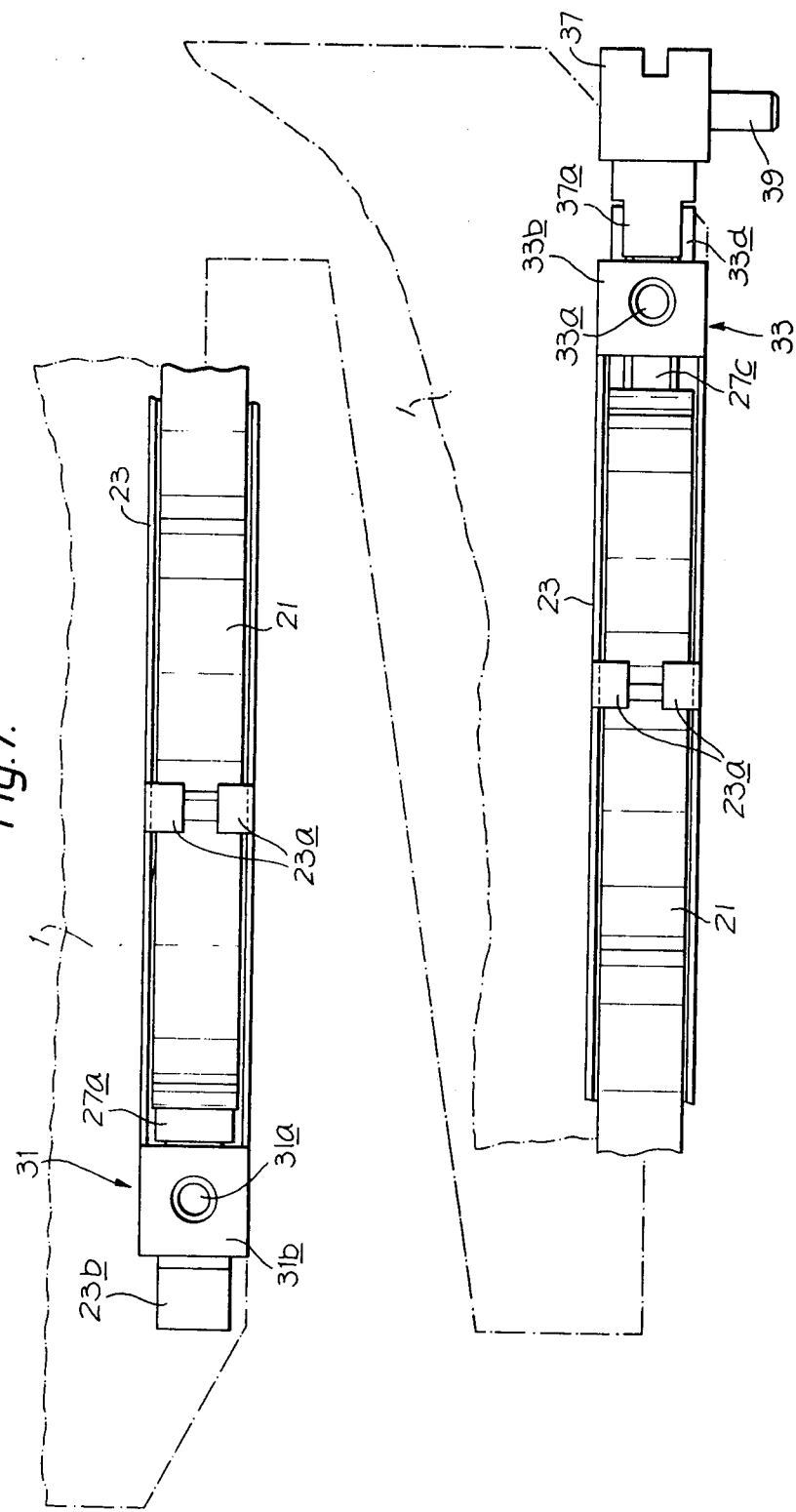

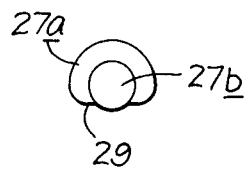
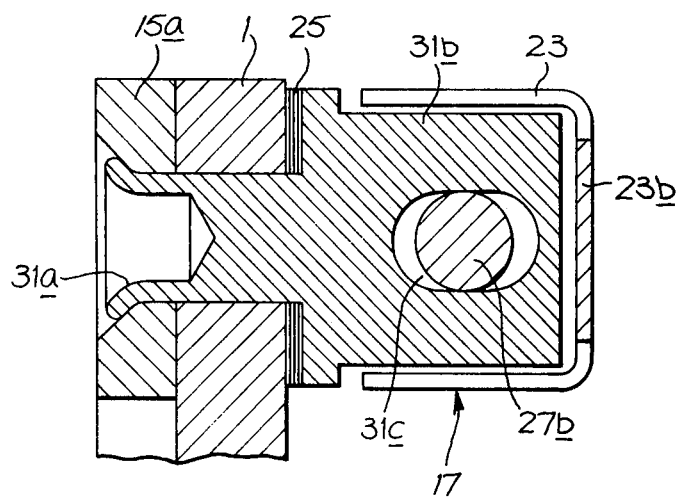
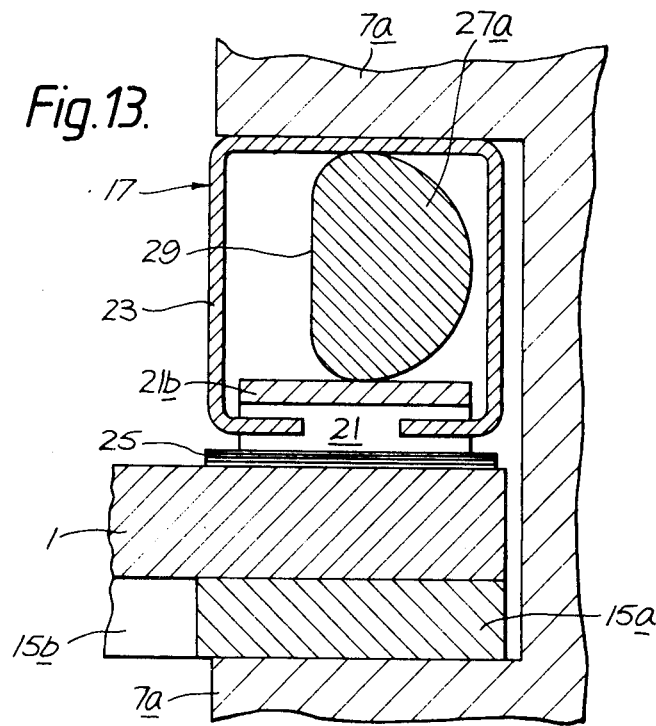

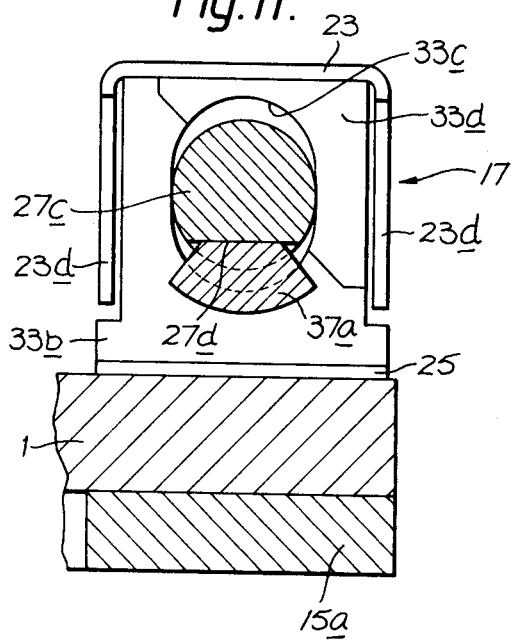
Fig.11.
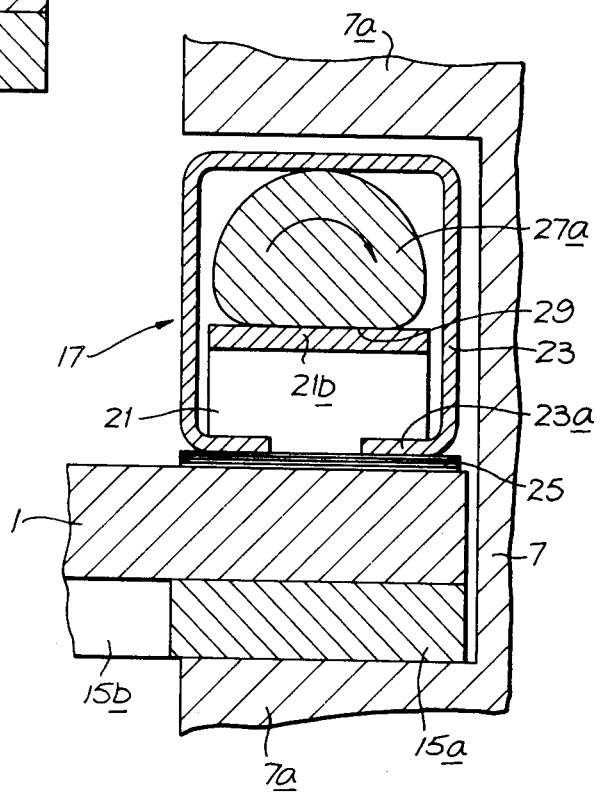
Fig.12.
Fig.14.
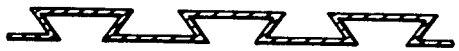

CLAMP ARRANGEMENTS

This invention relates to clamp arrangements and has especial relevance to clamp arrangements for securing parts in good thermal contact.

There exist many examples of clamp arrangements for securing printed circuit boards in good thermal contact with cold walls. It is the common practice to provide cold walls having pairs of opposed slots into which the lateral margins of printed circuit boards are inserted. The boards often carry a heat conductive ladder, the cross members of which are in close proximity to the electronic components mounted on the board, and the side members of which lie on the lateral margins of the board. A mechanism is provided which, when the board is within the opposed slots, serves to bias the board so that at least one of the side members of the heat conductive ladder makes good thermal contact with the cold wall.

The mechanisms employed for this purpose have included resilient pads adherent to the marginal surfaces of the board. These are, however, relatively weak devices and contact between the side members of the ladder and the cold walls occurs by relatively infrequent point contact only, thus increasing the probability of hot spots on the board. Increasing the spring pressure exerted by the pads may improve the heat dissipation from the board to the wall, but the increased friction between the wall and the side members of the ladder then renders board extraction difficult.

It is an object of the present invention to provide a releasable clamp arrangement suitable for use in securing members in good thermal contact in which the above mentioned difficulties are overcome.

According to the present invention there is provided an assembly which comprises a board and a mechanism for clamping a marginal portion of the board adjacent an edge between two opposed substantially flat parallel walls, the mechanism being mounted on a major surface of the board adjacent said edge and being capable of expansion in a direction normal to said marginal surface, characterised in that said mechanism comprises: a spring strip extending in the direction of its length along said marginal portion and having corrugations transverse to its length; and an elongate cam having a longitudinal axis extending along the length of said spring strip overlying said spring strip, and being constrained to permit rotational motion only about its longitudinal axis so as by contact between the cam and the spring strip to cause said expansion of the mechanism, and on limitation of expansion, compression of the corrugations in the spring strip.

When the cam has a certain angular position the said marginal portion of the board may be readily inserted between the said two opposed walls. In use, with the said marginal portion so received, rotation of the cam results in the clearance between the assembly and the opposed walls being taken up by substantially unimpeded expansion of the said mechanism. Thereafter, continued rotation of the cam causes the corrugated spring strip to be compressed so as to create a good substantially evenly distributed pressure between the major surface of the board remote from the mechanism and the adjacent opposed wall.

Preferably the mechanism further includes a channel member which substantially encloses the cam and the strip. In operation, during rotation of the cam, contact between the cam and the web of the channel moves the channel so that the web contacts the said one opposed wall, thereby avoiding rubbing contact between the cam and the said one opposed wall.

In one assembly said strip is a wave shaped element.

In an alternative assembly said strip is a zigzag shaped element.

Two clamp arrangements in accordance with the invention will now be described, by way of example only, with reference to the accompanying drawings in which:

FIG. 1 is a plan view of part of a box containing printed circuit boards provided with clamp arrangements according to the invention;

FIG. 2 ia an elevation of part of a first surface of a printed circuit board provided with the first clamp arrangement to be described;

FIG. 3 is an elevation of the reverse surface of the board of FIG. 2;

FIG. 4 is an end elevation of the board of FIG. 2;

FIG. 5 is a plan view of the first clamp arrangement;

FIG. 6 is a section on line VI—VI of FIG. 5;

FIG. 7 is an underneath plan view of the clamp arrangement of FIG. 5;

FIG. 9 is an end view of a cam shaft 27 forming part of the clamp in the direction of arrow IX in FIG. 6;

FIG. 10 is a section on line X—X of FIG. 5;

FIG. 11 is a section on line XI—XI of FIG. 6;

FIG. 12 is a section on line XII—XII on FIG. 6 showing the first clamp arrangement in a non-operative position;

FIG. 13 is the section of FIG. 12 showing the first clamp arrangement in an operative position;

FIG. 14 illustrates an alternative form for a spring element forming part of the first clamp arrangement;

Figure 17:
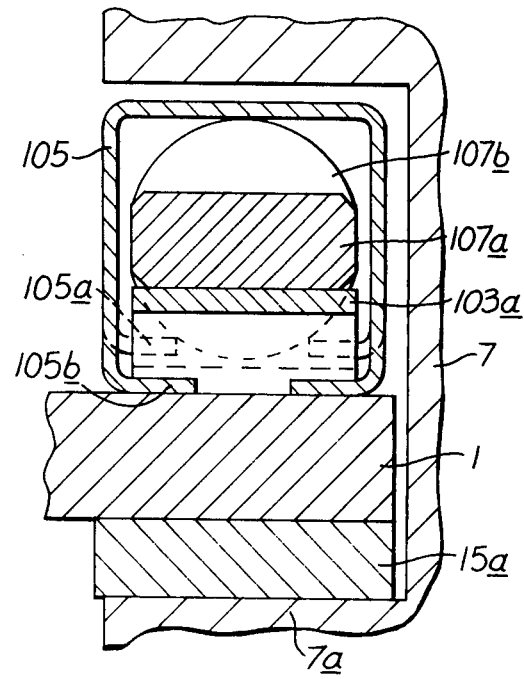
FIG. 17 is a section on line XVII—XVII of FIG. 15 showing the second clamp arrangement in a non-operative position.
Figure 18:
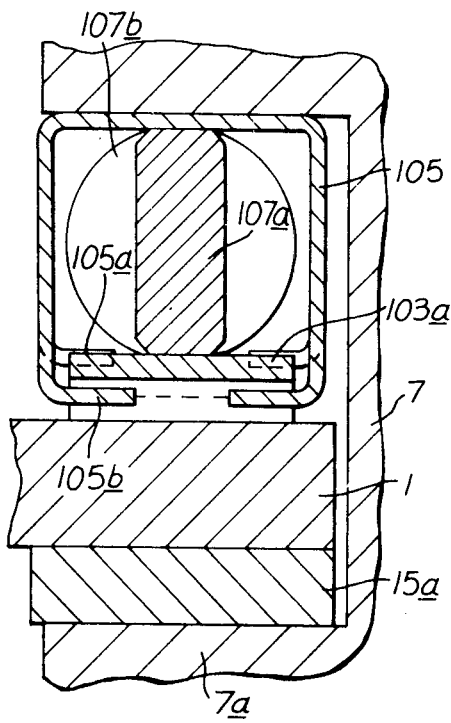
FIG. 18 is the section of FIG. 17 showing the second clamp arrangement in an operative position.

In all of the FIGS. 1 to 18 except FIGS. 13 and 18, the clamp arrangements are shown in their non-operative positions.

Figure 1:
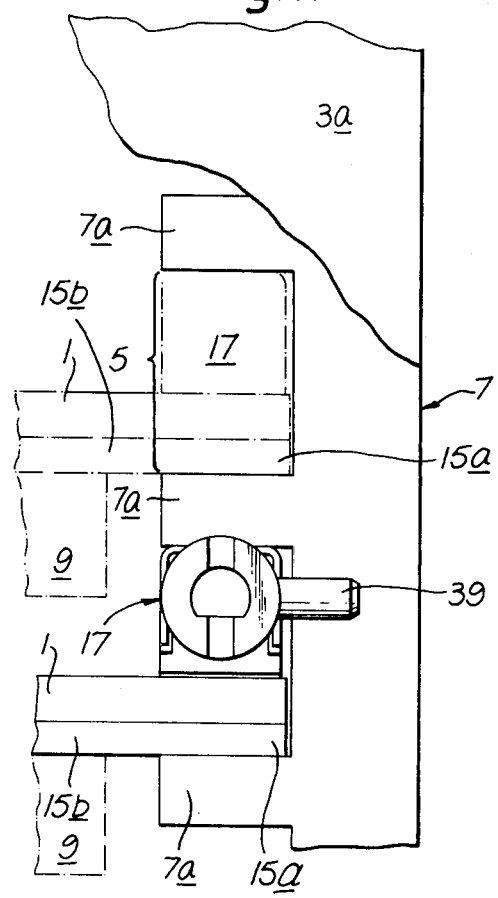

Referring firstly particularly to FIG. 1, the printed circuit boards 1 are disposed in parallel spaced relation in the box 3. The lateral marginal portions of each board are located in guide means in the form of slots 5 defined between adjacent pairs of ribs 7a formed on opposed side walls 7 of the box, the ribbed side walls constituting cold walls for dissipating heat generated by electronic components 9 mounted on a first major surface 11 of the board, and also providing physical support for the board. At the bottom of each board there is provided an electrical connector 13 which mates with a further connector (not shown) in the base (not shown) of the box 3. The box 3 is provided with a lid 3a, but this can only be fitted when the board clamp arrangements are all operated, as further described below.

Figure 2:
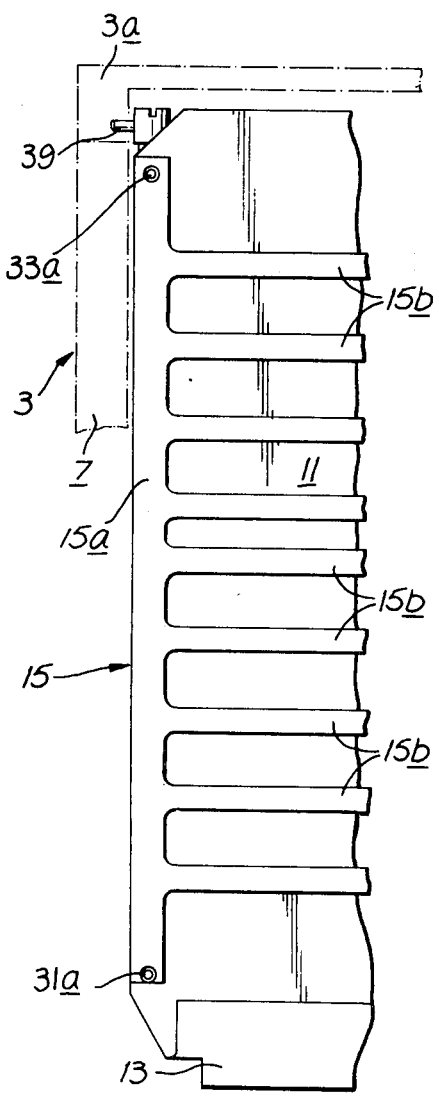

To aid heat dissipation, as best shown in FIG. 2, the surface 11 of each board carries a heat conductive ladder 15, the cross members 15b of which lie in close proximity to the electronic components 9, and the side members 15a of which extend along the lateral marginal portions of the surface 11.

Referring now also to FIGS. 3 and 4, in respect of each marginal surface carrying a side member 15a there is provided a mechanism 17 which is connected to the board 1 and extends along a corresponding margin of the reverse major surface 19 of the board 1.

Figure 8:
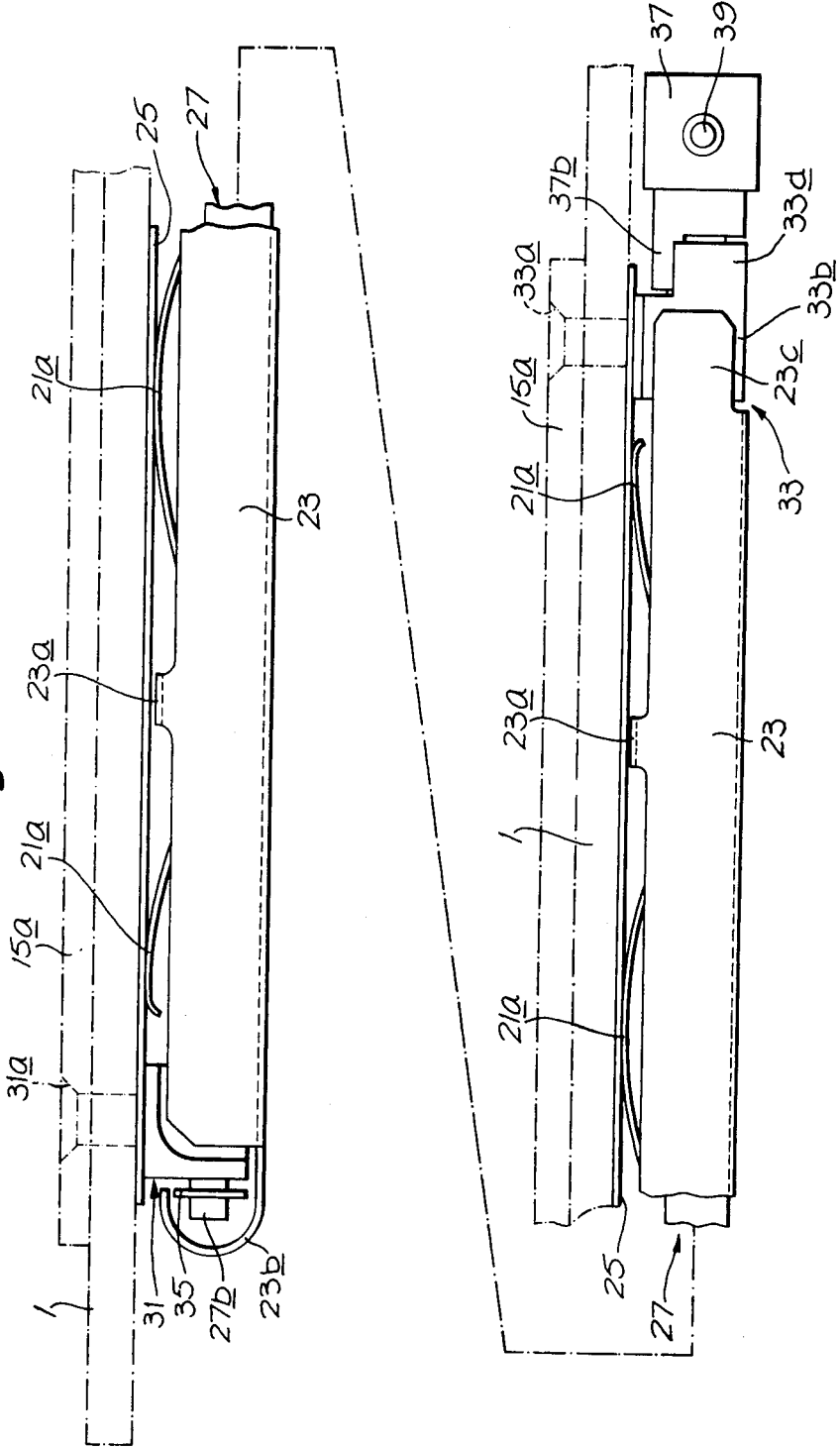
FIG. 8 is a side elevation of the clamp arrangement of FIG. 5.

Referring now particularly to FIGS. 5, 6, 7 and 8 each mechanism 17 includes a wave-shaped resilient metal element 21 within a channel member 23 extending longitudinally along the mechanism 17. As best shown in FIGS. 7 and 8, the sides of the channel member 23 have spaced pairs of inwardly bent lugs 23a which loosely retain the element 21 during assembly. The metal element 21 is disposed within the channel member 23 so that its axes of curvature are perpendicular to the length of the mechanism 17 and parallel to the surfaces 11 and 19 of the board 1. Thus, the element 21 alternately approaches (at regions 21a) and departs from (at regions 21b) a metal shim 25 glued onto the lateral marginal portion of the surface 19 of the board 1.

Referring now particularly to FIG. 6 a cam shaft 27 also extends longitudinally along the channel member 23 between the element 21 and the web of the channel member 23. Referring also to FIG. 9, over the major portion 27a of its length the cam shaft 27 has a flat 29, which, with the clamp inoperative, contacts the regions 21b of the metal element 21. At either end of the cam shaft 27 there are extensions 27b, 27c of relatively small circular cross section the end portion of one extension 27c having a flat 27d. At opposite ends of the mechanism 17 there are provided lower and upper posts 31, 33 respectively which extend through the metal shim 25, the board 1, and the adjacent side member 15a of the heat conductive ladder, the posts being secured by peening at their ends 31a, 33a respectively. The portions 31b, 33b of the posts 31, 33 projecting through the board 1 each have a bore 31c or 33c extending in the direction of the longitudinal axis of the mechanism 17 through which the extensions 27b, 27c of the cam shaft 27 respectively extend. Referring now also to FIGS. 10 and 11, the bores 31c and 33c have a width in a direction parallel to the surfaces 11 and 19 of the board 1 substantially equal to the diameter of the cam shaft extensions 27b, 27c, and a width in the transverse direction which is larger than this diameter, thus allowing limited movement of the cam shaft 27 in a direction perpendicular to the surface 19 of the circuit board 1, and allowing the cam shaft to rotate within the bores.

Referring now particularly to FIG. 6, axial movement of the cam shaft is limited by a circlip 35 fitting into a groove in the part of the cam shaft extension 27b projecting beyond the lower post 31. An extension 23b of the web of the channel member 23 is bent over to loosely enclose this end of the cam shaft extension 27b, and the circlip 35, whilst the lower end portions 23c of the flanges of the channel member 23 are a snap fit in grooves 32 formed at either side of the post 31. The edges of the grooves 32 thus limit downward movement of the channel member relative to the post 31.

Referring now particularly to FIGS. 6 and 11, extensions 23d of the flanges at the other end of the channel member 23 are a snap fit at either side of the upper post portion 33b. Fitting on the end of the cam shaft extension 27c there is a knob 37, which has an appropriately shaped bore to mate with the flat 27d on the cam shaft extensions 27c. The post portion 33b also has a projection 33d extending towards the knob 37 from the main body of the post which co-operates with a lug 37a on the knob 37 to limit rotation of the knob, and hence the cam shaft 27, to ninety degrees. Projecting radially from the knob 37 there is a pin 39 which when the clamp is non-operative, juts out over adjacent side wall 7 of the box 3.

Operation of the clamp arrangement is best understood with reference to FIGS. 12 and 13. FIG. 12 depicts the cam shaft portion 27a in the non-operative position of the clamp with its flat 29 contacting the regions 21b of the metal element 21. To operate the clamp the knob 37, and consequently the cam shaft 27 is rotated clockwise through ninety degrees, bringing the curved surface of the portion 27a of the cam shaft 27 into contact with the regions 21b, thus urging the regions 21b away from the web of the channel member 23. The resultant compression of the metal element 21 reacting through the cam shaft 27 urges the channel member 23 into contact with the adjacent rib 7a, the side member 15a of the heat conductive ladder 15 on the surface 11 of the board being simultaneously urged into intimate contact with the adjacent rib 7a. By reason of the form of the element 21, a firm equal pressure is exerted all along the marginal portion of the board 1 ensuring good thermal contact between the side member 15a and the rib 7a, all along the length of the side member 15a. The non operative position of the clamp is best shown in FIG. 1 where the pin 39 lies in a position jutting out over the adjacent cold wall rib 7a.

It is a feature of the embodiment that the position of the pin 39 gives an indication of whether the clamp is operative, i.e. whether the lateral portion of the board is maintained in close contact with the cold wall rib 7a. It will be appreciated as best shown in FIGS. 1 and 2 that the box lid 3a can only be fitted when the clamp is operative, i.e. the pin is not jutting over the side wall 7 of the box 3 having been turned counter-clockwise through 90° with respect to the portion shown in FIG. 1 so as to jut out over the middle of the three ribs 7a shown in that figure.

An important feature of the invention is that the clamping force is dependent not only on the material of the element 21 and the 'throw' of the cam shaft 27, but also on the shape of, and in particular the number of bends in, the element 21 along its length. The design of a clamp arrangement to obtain a desired clamping force is thus facilitated.

In this connection it will be appreciated that the thickness of the shim 25 is chosen in relation to the width of the slot 5 so that a desired clamping force is obtained.

Referring now to FIGS. 15 to 18, the second clamp arrangement to be described comprises a mechanism 101 which is connected to a margin of a printed circuit board, the arrangement being designed to be inserted in a box, the board and box being similar to these already described with respect to the first clamp arrangement. Accordingly the features of the board and box which are identical to those in the previous figures are denoted by the same reference numerals.

Figure 15:
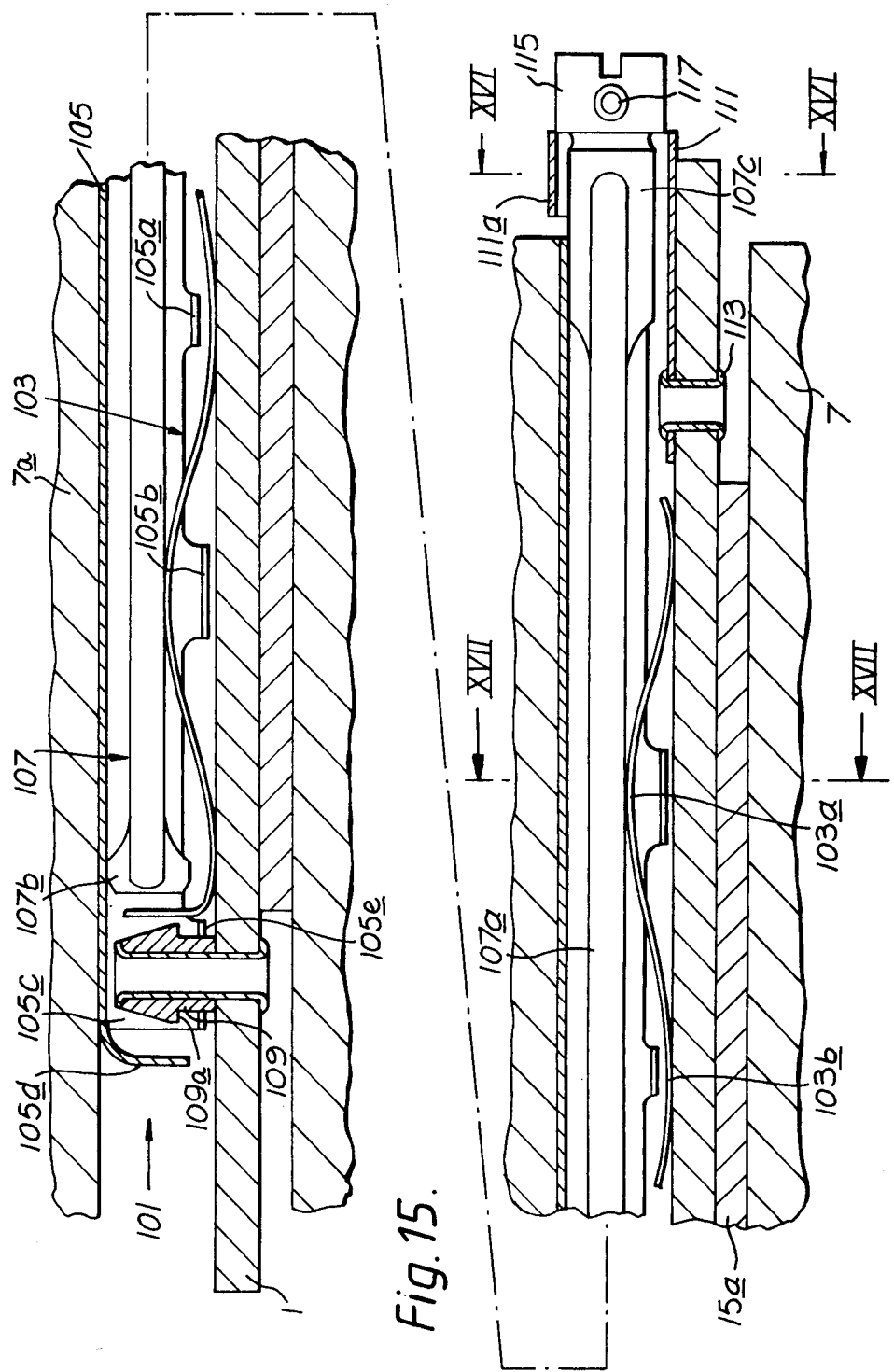
FIG. 15 shows a section through the second clamp arrangement to be described.

As best shown in FIG. 15, each mechanism 101 includes a wave-shaped resilient metal element 103 within a channel member 105 extending longitudinally along the mechanism 101. The sides of the channel member 105 have alternating spaced pairs of upper and lower inwardly bent lugs 105a, 105b respectively, the metal element being threaded through the channel member 105 such that the regions 103b of the element which approach the printed circuit board 1 are interposed between the upper lugs 105a and the board, and the regions 103a of the element which depart from the printed circuit board are interposed between the lower lugs 105b and the web of the channel member. A cam shaft 107 also extends longitudinally along the channel member 105 between the element 103 and the web of the channel member 105. Referring now also to FIG. 17, the major portion 107a of the camshaft 107, corresponding to the portion 27a of the camshaft 27 described in relation to the first clamp arrangement has a generally rectangular cross section. At either end of the camshaft are lower and upper extensions 107b, 107c respectively, having circular cross sections of a diameter substantially equal to the cross sectional dimension of the portion 107a, the longitudinal axes of symmetry of the portion 107a, and the extensions 107b, 107c being co-linear.

Figure 16:
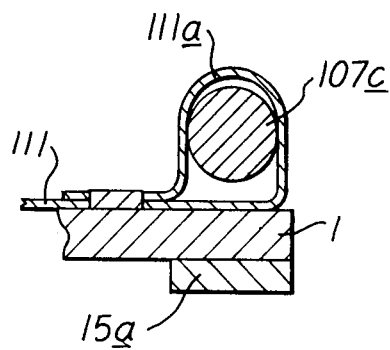
FIG. 16 is a section on line XVI—XVI of FIG. 15.

At the lower end of the mechanism 101 there is provided a post 109 which extends through the board and is secured thereon by peening. The flanges 105c of the channel member 105 have shoulders 105e which are a snap fit below a shoulder 109a on the post 109, so that the channel member is thus loosely coupled to the board 1, an extension 105d of the web of the channel member being bent over to loosely enclose the post. Referring now also to FIG. 16, at the upper end of the mechanism 101 is a bracket 111 which is secured to the board 1 by a rivet 113. A portion 111a of the bracket is bent over on itself to form an aperture through which the portion 107c of the cam shaft 107 extends, the camshaft portion 107c being able to rotate within the bracket portion 111a and also move to a limited extent in a direction normal to the circuit board 1. A knob 115 is attached to the upper end of the cam shaft portion 107c of dimension such that the downward movement of the cam shaft 107 is prevented by the bracket portion 111a. Projecting radially from the knob 115 there is a pin 117 which, as in the case of the pin 39 in the first clamp arrangement, when the clamp is non-operative, juts out over adjacent side wall 7 of the box 3.

Operation of the second clamp arrangement is in corresponding manner to that of the first clamp arrangement described herebefore. In the non-operative position, depicted in FIG. 17, one of the larger faces of the main portion 107a of the cam shaft 107 contacts the regions 103a of the metal element 103. To operate the clamp the knob 115 and thus the cam shaft 107 is rotated through ninety degrees to the position depicted in FIG. 18, thus causing compression of the metal element 103 which causes expansion of the mechanism.

One particular feature of the second clamping is that the elastic range of the metal element 103 is chosen to be less than the 'throw' of the cam shaft 107. Initial setting up of the clamp arrangement is performed by placing the arrangement in a slot of a minimum size while in a non-operative state, and rotating the cam shaft 107 such that the spring element 107 takes a permanent set even when the arrangement is removed from the slot. This procedure ensures that the clamp arrangement can be used in slots of differing widths, with no necessity for the use of a shim to take up the 'slack', with large slots, as in the first clamping arrangement described. It will be appreciated, however, that other forms of cam shaft, e.g. "D" shaped as in the first clamp arrangement described herebefore, may also be designed for use in similar fashion, without the use of a shim on the circuit board. Similarly a shim may be incorporated into the second clamp arrangement shown in FIGS. 15 to 18.

It will be understood that in the second clamp arrangement, the use of a rectangular cross-section cam shaft makes the action on rotation of the shaft from the position shown in FIG. 17 to the position shown in FIG. 18 more positive than for a "D" shaped cam shaft, and there is thus more tactile feedback to the operator. The design of the mechanism 101 is therefore somewhat simplified with respect to the mechanism of first clamp arrangement. The "stop" arrangement comprising the components 33b, 33d, 37a described in the first clamp arrangement, which limits rotation of the cam shaft to ninety degrees for example is omitted. The omission of the "stop" arrangement avoids the possibility of destructive overloads being applied, as can easily occur with a "D"-shaped cam shaft due to poor tactile feedback. Furthermore the omission of the "stop" arrangement allows the cam shaft to be rotated in either direction.

The rectangular cross section cam shaft has the additional advantages that it is comparatively easy to manufacture, and provides a weight saving over a "D" shaped cam shaft.

It will be appreciated, however, that most of the features of the first and second clamp arrangement are interchangeable, for example the rectangular cross-section cam shaft 107 of the second clamp arrangement may be adapted to be supported for rotation by two posts as in the first clamp arrangement, and a "stop" arrangement included, whilst the "D" shaped cam shaft 27 of the first arrangement may be adapted to be supported for rotation by a bracket as in the second arrangement.

It will also be appreciated that while in both clamp arrangements described herebefore the elements 21 and 103 are wave-shaped in other arrangements in accordance with the invention different shapes may be used, for example, a zig-zag shape such as the shape illustrated in FIG. 14, i.e. an acute angled key pattern shape.

We claim:

1. An assembly comprising a board and a mechanism for clamping a marginal portion of the board adjacent an edge between two opposed substantially flat parallel walls, the mechanism being mounted on a major surface of the board adjacent said edge and being capable of expansion in a direction normal to said marginal surface, characterized in that said mechanism comprises: a spring strip extending in the direction of its length along said marginal portion and having corrugations transverse to its length; and an elongate cam having a longitudinal axis extending along the length of said spring strip overlying said spring strip, and being constrained to permit rotational motion only about its longitudinal axis, together with a limited motion in a direction normal to said marginal surface so as by contact between the cam and the spring strip to cause, on rotation of said cam expansion of the mechanism, and on limitation of expansion, compression of the corrugations in the spring strip.

2. An assembly according to claim 1 in which the elastic range of said spring strip is less than the throw of said cam.

3. An assembly according to claim 1 in which there is provided a shim which is interposed between said spring strip and said marginal portion of the board.

4. An assembly according to claim 1 wherein said cam carries a pin whose angular position indicates whether the clamp mechanism is in an operative position.

5. An assembly according to claim 1 in which said cam has a first substantially flat surface, and a second curved surface, both surfaces extending along the length of the cam, said first surface lying closer to said longitudinal axis than said second surface.

6. An assembly according to claim 1 in which said cam is substantially rectangular in cross section.

7. An assembly according to claim 1 in which said spring strip is a wave shaped element.

8. An assembly according to claim 1 in which said spring strip is a zig-zag shaped element.

9. An assembly according to claim 8 in which said spring strip is formed in an acute angled key pattern.

10. An assembly according to claim 1 in which the mechanism includes a channel member which substantially encloses said cam and said spring strip.

11. An assembly according to claim 10 in which said cam lies between said spring strip and the web of said channel member.

12. An assembly according to claim 10 including a bracket towards one end of said edge which supports said cam for rotation, also allowing limited movement of said cam in a direction normal to said marginal surface.

13. An assembly according to claim 12 in which an extension of said cam fits into an aperture defined within said bracket, which allows rotation of said end portion within said aperture, and also allows limited movements of the cam in a direction normal to said marginal surface.

14. An assembly according to claim 12 in which a post is provided at one end of said edge onto which said channel member is a snap fit.

15. An assembly according to claim 10 in which two posts are secured through said board towards either end of said edge, both posts having a bore into which a respective end portion of said cam fits such that the cam is supported for rotation about its longitudinal axis, said end portions also allowing limited movement of the cam in a direction normal to said marginal surface.

16. An assembly according to claim 15 in which there is a projection on one of said posts which co-operates with a lug connected to said cam to limit rotation of said cam to substantially ninety degrees.

17. An assembly according to claim 15 in which said channel member is a snap fit on said posts.

18. An assembly according to claim 17 in which there is a groove formed on one of said posts which mates with a portion of the adjacent channel member to limit the movement of said channel member in one direction along said longitudinal axis.

19. A mechanism for use in an assembly comprising a board and a mechanism for clamping a marginal portion of the board adjacent an edge between two opposed substantially flat parallel walls, the mechanism being mounted on a major surface of the board adjacent said edge and being capable of expansion in a direction normal to said marginal surface, characterized in that said mechanism comprises: a spring strip extending in the direction of its length along said marginal portion and having corrugations transverse to its length; and an elongate cam having a longitudinal axis extending along the length of said spring strip overlying said spring strip, and being constrained to permit rotational motion only about its longitudinal axis, together with a limited motion in a direction normal to said marginal surface so as by contact between the cam and the spring strip to cause, on rotation of said cam expansion of the mechanism, and on limitation of expansion, compression of the corrugations in the spring strip.

* * * * *